Nov. 19, 1968 B. ROSS ET AL 3,411,952

PHOTOVOLTAIC CELL AND SOLAR CELL PANEL

Filed April 2, 1962

BERND ROSS
AUSTIN H. HERBST
INVENTORS

BY M. Jabin

ATTORNEY 3,411,952
Patented Nov. 19, 1968

3,411,952
PHOTOVOLTAIC CELL AND SOLAR CELL PANEL
Bernd Ross and Austin H. Herbst, Arcadia, Calif., assignors, by mesne assignments, to Globe-Union Inc., Milwaukee, Wis., a corporation of Delaware
Filed Apr. 2, 1962, Ser. No. 184,347
10 Claims. (Cl. 136—89)

The present invention relates to semiconductor devices, and more particularly to photovoltaic cells.

The use of photovoltaic cells, commonly called solar cells, is well known in the art. Solar cells are conventionally obtained as slices cut from specially prepared single crystal semiconductor ingots. The greater the area of a solar cell, the greater is the power obtained from the cell. But, the greater the area, the less is the efficiency of the cell. By connecting many little cells together as a panel, it is possible to increase the power without decreasing the efficiency. Present methods of interconnecting many solar cells are expensive, inconvenient, and unreliable.

It is an object of the present invention, therefore, to provide a novel solar cell.

It is another object of the present invention to provide a solar cell so constructed that it can be conveniently interconnected with a plurality of similarly constructed solar cells as a large-area solar-cell panel.

According to the preferred embodiment of the present invention, a solar cell comprises a P-type conductivity region wrapped around the top, one edge, and less than one-half, defined as a minor portion, of the bottom of the N-type conductivity body portion of a semiconductor wafer. One metal electrode is ohmically connected to the N-type conductivity region along the remaining portion of the bottom, and another metal electrode is ohmically connected to the P-type region on the bottom and side of the wafer and gridded across its top. The solar cells can then be bonded to conducting strips in a series or parallel planar pattern.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
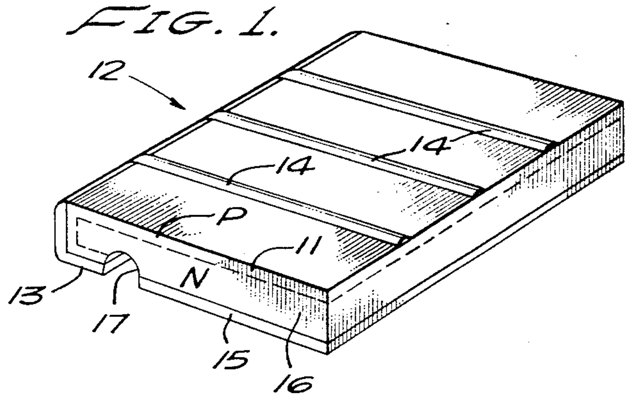
FIGURE 1 is an isometric view of a solar cell according to the present invention.

Referring now to the drawings, FIGURE 1 shows P-type conductivity region 11 covering the entire top surface of silicon solar cell 12, continuing completely around one edge, and extending a small distance onto the bottom surface of the cell. Ohmic contact 13 covers the bottom and edge portions of P-type region 11 and extends across the top of the cell to form the collecting metal grid strips 14. Ohmic contact 15 covers the entire N-type region 16 of the bottom of the cell, except for shallow groove 17, which runs across the bottom and separates the P and N regions. The ohmic contacts can be formed by the chemical deposition of nickel.

Contact grid strips 14 increase the efficiency of the cell. Incident light gives rise to electron-hole pairs, and in the absence of the grid strips, the holes would have to travel an average distance of one-half the width of the top surface of the cell before reaching contact 13 where it runs along the edge of the cell. In the presence of grid strips 14, the holes need only travel a much shorter average distance, namely one-half the distance between adjacent grid strips, resulting in an increased efficiency, because of the reduction in series resistance.

The use of grids presents a conflict in that a wide grid strip has a low resistance, but a wide grid strip also decreases the area of the surface that is exposed to the incident light. An optimum grid for a $1 \times 2$ cm. solar cell has been found to be five lines or strips with a spacing of 0.4 cm. and a strip width of $6 \times 10^{-3}$ cm. Such a grid reduces the series resistance of the P-type region by a factor of $5 \times 10^{-2}$.

With this wrap-around cell design, the collector electrode on the top surface of conventional cells is no longer required. Its elimination will increase the effective exposed area of the solar cell by 10% and thereby increase the cell efficiency. Reducing the area of the N contact on the bottom of the cell will decrease the collection efficiency, but this decrease will be small, however, and will become smaller as the depth and width of the groove on the back side of the cell is decreased, as the width of the P contact on the bottom of the cell is decreased, and as the resistivity of the semiconductor material of region 16 is decreased. The P contact should cover a minor portion of the bottom surface. The minimum width of the groove is determined by the ability to mount the cells with no electrical shorting.

Figure 2:
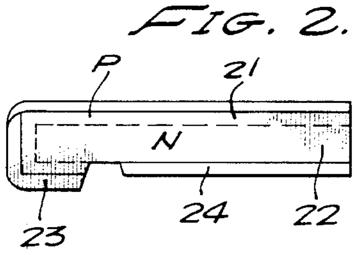
FIGURE 2 is a side view of a variation of FIGURE 1.

FIGURE 2 shows a slight variation of the solar cell. P-type region 21 can be formed by doping the entire exterior surface of an N-type silicon wafer with boron trichloride, and etching away, lapping off, or sandblasting off the P-type region from three edges and the major portion of the bottom surface of the solar cell until N-type silicon region 22 is exposed. It will only be necessary to remove about one mil of silicon from the bottom surface of the cell, resulting in a one-mil step between the P and N surfaces on the bottom of the cell. This step, which is shown exaggerated in FIGURE 2 for purposes of illustration, is actually so slight that it presents no problem in mounting the cell. Nickel electrodes 23 and 24 can then be chemically or vapor deposited on the P and N regions, respectively.

Figure 3:
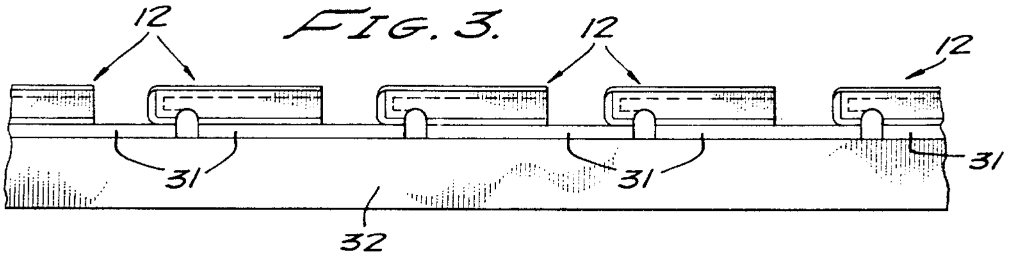
FIGURE 3 is a side view of a plurality of the cells of FIGURE 1 connected in series.

FIGURE 3 shows solar cells 12 bonded to conductive metal strips 31, which are mounted upon insulating substrate 32. The substrate can be constructed so as to have parallel conductive strips across its top surface, alternating with narrow insulating strips. The conductive strips are sufficiently wide to accommodate the bottom P contact on one cell, the bottom N contact on an adjacent cell, and a narrow separation space between the cells. The insulating strip between the conducting strips on the substrate has the same width as the groove cut across the bottom of the cell. The cells are positioned so that the insulating strip is located directly under the groove in the bottom of the cells.

Figure 4:
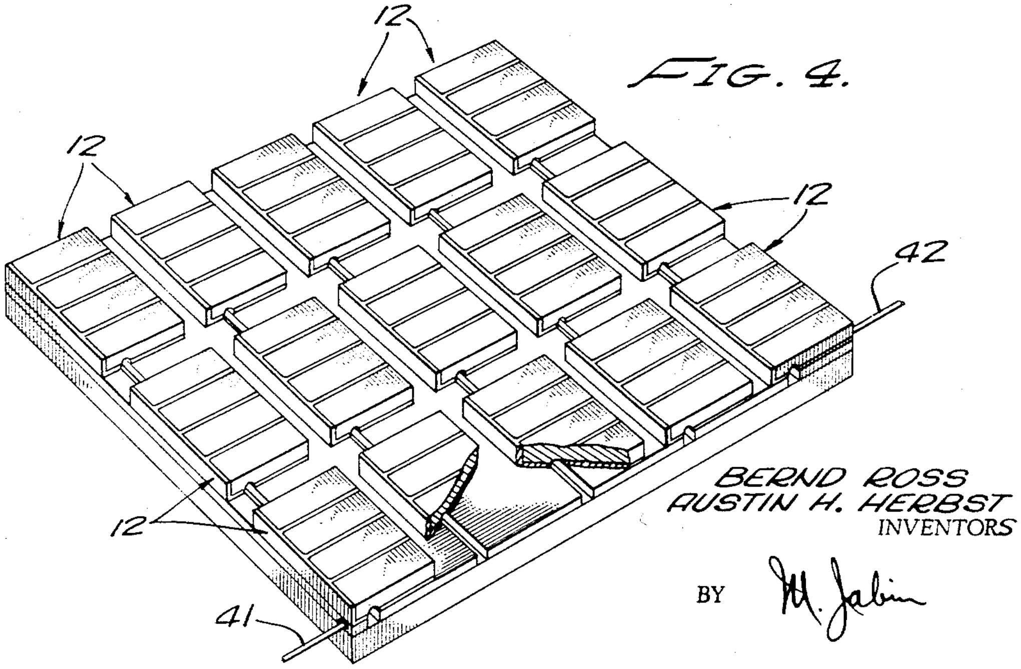
FIGURE 4 is an isometric view of the solar cell panel of FIGURE 3.

FIGURE 4 shows that each of the cells lying along a single pair of conducting strips on the panel is at the same potential and connected in parallel, whereas the cells bridging adjacent conducting strips are connected in series. Any specific series-parallel arrangement can be developed by simply adjusting the relative length and number of conductive strips. The only required wire connections would be leads 41 and 42, which are attached to the first and last metallic strips on the panel, thereby eliminating wire harnesses. In this arrangement, if any one cell becomes inactive during operation of the panel, the circuit is simply shunted around that cell to the other cells in parallel.

To assemble the panel, the conductive strips on the substrate are first covered with a thin, even layer of a low-melting solder. This thin layer of solder can be applied to the bottom contacts on the solar cells instead, or in addition. The solder used must have a melting temperature above the maximum operating temperature of the panel, and when melted it must wet the entire area of the conductive strips and the nickel contacts on the cells. After distribution of the bonding solder, all solar cells to be mounted on the substrate are accurately positioned, using jigs. The entire panel is then placed in a furnace to fuse the solder, and subsequently cooled to freeze the solder. The end result of this single operation is to bond all of the cells to the panel, and to complete all electrical connections to all of the cells on the panel.

The selection of a low melting solder or alloy to bond the solar cells to the panel must take into account several factors. This solder, when molten, must effectively wet both the nickel electrodes on the cell and the conducting strip on the supporting panel. The heating cycle and molten solder contact must not degrade the nickel contact on the cell. The solder must not undergo phase transitions at the temperatures of panel operation. A lead-tin solder may be used, although many other alloys which contain lead, indium, tin, cadmium, and bismuth as major components can also be used.

Metal bonding of the solar cells to the substrate can be done using any metal for the substrate construction, since it will be possible to plate the panel with any desired metal. However, the coefficient of thermal expansion and the modulus of elasticity of the substrate panel must be considered. In this process the solar cells will likely be bonded to the substrate at a temperature of about 200° C. As the assembled panel is then cooled, stresses will arise from the differential thermal expansion of the silicon and the panel. For any metal having a coefficient of thermal expansion greater than that for silicon, and this is true for nearly all metals, the silicon solar cells will be placed under a compressive stress. The magnitude of this stress will depend on how much the panel temperature is below the bonding temperature, on the difference in the coefficient of thermal expansion and modulus of elasticity of each material, and how much the stresses will be modified by deformation of the panel. The relative stresses developed in solar cells bonded to several rigid metal substrates can be estimated using average values for coefficients of thermal expansion and assuming no panel deformation. Estimates show that the compressive stresses developed in the silicon will be greatest for an aluminum panel, smaller by a factor of one-half for beryllium, smaller again by a factor of one-half for titanium, and nearly zero for molybdenum.

Since contacts to the solar cells must be electrically insulated from the substrate panel, it is first necessary to form an adherent insulating layer over the entire substrate. One technique is the formation of aluminum oxide by anodizing an aluminum substrate. A major advantage of anodizing is that dependable, chemically stable, pinhole-free insulating layers result. If the substrate panel is not anodizable, it will be possible to deposit anodizable coatings by plating or vacuum deposition. Alternative approaches can use a deposited ceramic coating, a glass enamel, or an organic resin. Conducting strips can then be deposited on the insulating layer. This can be done by vacuum deposition, followed by electroplating to build up the necessary thickness of conductor, by using a conductive paint, or by other printed-circuit techniques.

The described solar cell panel eliminates the breakage problems resulting from the saw-tooth profile of shingled solar cells and has the advantages of rigid uniform mounting, ease of panel fabrication, reduction of the complexity of multi-sandwich panels, and ease of electrical connection.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

We claim:

1. A photovoltaic cell having a top, an edge surface and a bottom, comprising:

(a) a first-type conductivity region separated from a second-type conductivity region by a P-N junction, said first-type region extending across the top, continuing across a minor portion of the total edge surface, and continuing across a minor portion of the bottom of said cell, (b) a first electrode in ohmic contact with said first-type region on the top, edge surface, and bottom of said cell, and (c) a second electrode in ohmic contact with said second-type region on the bottom of said cell, said electrodes being sufficiently apart to prevent electrical shorting.

2. A photovoltaic cell comprising:

a generally rectangular body of semiconductor material, said body having a bulk region of a first conductivity type and a surface region of a second conductivity type, said surface region covering substantially the entire top surface of said body and terminating at the sides and at one end of said body and continuing around the other end thereof, and extending over a minor portion of the bottom surface of said body;

a first ohmic contact formed on said minor portion of said bottom surface;

a second ohmic contact formed on a major portion of said bottom surface of said body and extending substantially to said one end thereof; and insulating means separating said first and second ohmic contacts.

3. A photovoltaic cell comprising:

a generally rectangular body of semiconductor material, said body having a bulk region of a first conductivity type and a surface region of a second conductivity type, said surface region covering substantially the entire top surface of said body and terminating at the sides and at one end of said body and continuing around the other end thereof and extending over a minor portion of the bottom surface of said body;

a first ohmic contact covering said minor portion of said bottom surface, said other end, and extending across said top surface in the form of a plurality of grid strips;

a second ohmic contact formed on a major portion of said bottom surface of said body and extending substantially to the sides and said one end thereof; and insulating means separating said first and second ohmic contacts.

4. The cell of claim 3 wherein said insulating means comprises an air gap.

5. The cell of claim 3 wherein said portion of said first ohmic contact covering said minor portion of said bottom surface and said second ohmic contact are substantially planar.

6. A solar-cell panel comprising:

a substrate including a plurality of conducting strips;

a plurality of groups of photovoltaic cells, each of said cells comprising a generally rectangular body of semiconductor material, said body having a bulk region of a first conductivity type and a surface region of a second conductivity type covering the top surface of said body, said surface region terminating at the sides and at one end of said body and continuing around the other end thereof and extending over a minor portion of the bottom surface of said body; a first ohmic contact formed on said minor portion of said bottom surface; a second ohmic contact formed on a major portion of said bottom surface of said body and extending substantially to said sides and one end thereof, and insulating means separating said first and second ohmic contacts;

a first group of said cells having their first ohmic contacts electrically connected to a first of said conducting strips and their second ohmic contacts electrically connected to a second of said conducting strips;

a second group of said cells having their first ohmic contacts electrically connected to said second conducting strip and their second ohmic contacts electrically connected to a third of said conducting strips.

7. The apparatus of claim 6 wherein said first ohmic contact extends across said surface region in the form of a plurality of grid strips.

8. The apparatus of claim 6 wherein said insulating means is aligned with said conductive strips.

9. Apparatus according to claim 6 in which said cells are soldered to said strips, said first-type conductivity region is P-type silicon, said second-type conductivity region is N-type silicon, and said substrate has a coefficient of expansion approximating that of silicon.

10. Apparatus according to claim 9 in which said substrate comprises an adherent insulating layer on top of a supporting layer, and said conducting strips are parallel metal layers upon said insulating layer.

References Cited

UNITED STATES PATENTS

| | | | |
|---|---|---|---|
| 2,644,852 | 7/1953 | Dunlap | 136—89 X |
| 2,820,841 | 1/1958 | Carlson et al. | 136—89 |
| 3,255,047 | 6/1966 | Escoffery | 136—89 |
| 3,261,074 | 7/1966 | Beauzee | 136—89 X |
| 3,278,811 | 10/1966 | Mori | 317—234 |
| 2,114,591 | 4/1938 | Clark | 136—89 |
| 2,428,537 | 10/1947 | Veszi et al. | 136—89 |
| 2,780,765 | 2/1957 | Chapin et al. | 136—89 |
| 2,794,846 | 6/1957 | Fuller | 136—89 |
| 3,009,981 | 11/1961 | Wildi et al. | 136—89 |

ALLEN B. CURTIS, *Primary Examiner.*